(12) United States Patent
Sechi et al.

(10) Patent No.: US 6,639,538 B1
(45) Date of Patent: Oct. 28, 2003

(54) REAL-TIME TRANSIENT PULSE MONITORING SYSTEM AND METHOD

(75) Inventors: Paolo G. Sechi, Woodside, CA (US); Richard C. Adamo, Palo Alto, CA (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 10/145,492

(22) Filed: May 14, 2002

(51) Int. Cl.[7] .................................................. H03M 1/12
(52) U.S. Cl. ........................................ 341/155; 341/161
(58) Field of Search ................................. 341/155, 161, 341/159, 160, 158

(56) References Cited

U.S. PATENT DOCUMENTS

| | | |
|---|---|---|
| 3,578,957 A | 5/1971 | Gatlin |
| 3,629,852 A | 12/1971 | Thexton et al. |
| 3,711,771 A | 1/1973 | Hume et al. |
| 4,023,071 A | 5/1977 | Fussell |
| 4,301,508 A | 11/1981 | Anderson et al. |
| 4,368,519 A | 1/1983 | Kennedy |
| 4,422,037 A | 12/1983 | Coleman |
| 4,442,496 A | 4/1984 | Simon et al. |
| 4,870,534 A | 9/1989 | Harford |
| 5,170,359 A | 12/1992 | Sax et al. |
| 5,440,566 A | 8/1995 | Spence et al. |
| 5,666,255 A | 9/1997 | Muelleman |
| 5,724,219 A | 3/1998 | Narita |
| 5,740,080 A | 4/1998 | Shook et al. |
| 5,914,662 A | 6/1999 | Burleigh |
| 5,959,815 A | 9/1999 | Gilbert |
| 6,018,300 A | 1/2000 | Dowden et al. |
| 6,026,355 A | 2/2000 | Rahman et al. |
| 6,064,172 A | 5/2000 | Kuznetsov |
| 6,097,582 A | 8/2000 | John et al. |
| 6,104,582 A | 8/2000 | Cannon et al. |
| 6,118,639 A | 9/2000 | Goldstein |
| 6,175,808 B1 | 1/2001 | Chai |
| 6,297,760 B1 * | 10/2001 | Hungerbuehler ............ 341/155 |
| 6,424,927 B1 | 7/2002 | Sechi et al. |

FOREIGN PATENT DOCUMENTS

DE  41 33 209 A1  4/1993

* cited by examiner

*Primary Examiner*—Brian Young
(74) *Attorney, Agent, or Firm*—Guerin & Rodriguez, LLP; Michael A. Rodriguez

(57) ABSTRACT

Described are a system and method for monitoring and characterizing a stimulus in order to detect transient phenomena. An analog signal represents the stimulus. Conversion circuitry receives the analog signal and continuously converts the analog signal into digital data. Digital circuitry continuously receives the digital data from the conversion circuitry and dynamically computes from the digital data a value that characterizes a parameter of the stimulus while the digital circuitry continuously receives new digital data from the conversion circuitry. The digital circuitry can be reconfigured to characterize a different parameter for the same type or for a different type of stimulus.

24 Claims, 6 Drawing Sheets

REAL-TIME TRANSIENT PULSE MONITORING SYSTEM AND METHOD

FIELD OF THE INVENTION

The invention relates generally to monitoring systems. More particularly, the invention relates to systems and methods for real-time monitoring and measuring of transient phenomena.

BACKGROUND

Transient phenomena pose a serious threat to systems exposed to such phenomena. Transients can occur at any time with varying amplitude, frequency, and duration. The magnitude or energy content of the transient phenomena can affect the electronic and mechanical components of these systems to cause permanent or temporary malfunction. Because of the destructive potential of transients, industry has developed various transient monitoring systems for detecting and measuring transients that occur near important or critical systems.

Lightning is one potentially destructive transient phenomenon. For example, current spacecraft launching procedures typically suspend launch operations should lightning occur directly or nearby until system level tests are performed to ensure that electromagnetic transients produced by the lightning have not damaged or disturbed the payload or launch vehicle systems. These retest operations are costly and often unnecessary. By strategically placing electromagnetic sensors near the payload and launch vehicles, an assessment of the potential damage caused by lightning-induced transients can be made by evaluating the transient information captured by the sensors.

Transient monitoring systems measure certain key parameters that are indicative of the potentially destructive nature of detected transients. For lightning-induced electromagnetic transients, for example, key parameters include positive and negative peak amplitudes, and duration, energies, and maximum rates-of-change or rise-times of positive and negative transients. Often, such parameters are empirically determined to correlate to problems experienced by electronic systems due to transients.

To characterize key parameters of transient phenomena, conventional transient monitoring systems digitize the analog input signal and save the digital data in memory for subsequent download and evaluation. A disadvantage of this technique is that the digital data must be post-processed, thus the characterization of the key parameters is not available in real time. Secondly, while the digital data is being downloaded from the memory, the system is offline, that is, the system is not collecting additional digital data. For applications monitoring transient events, input transients will go undetected if they occur during this transfer period. Repetitive or closely-grouped high frequency transients, such as those that occur with lightning, increase the likelihood of a missed transient. The loss of such information can lead to an erroneous and potentially catastrophic conclusion that the monitored system has not been exposed to harmful transients.

SUMMARY

Objectives of the present invention are to provide a transient pulse monitor that is capable of measuring transients in real-time and to perform such real-time measurements without experiencing dead time, i.e., a period during which the monitor can miss a transient. Another objective is to make accurate real-time measurements. Yet another objective is for the monitor to process large amounts of data with minimal data storage. Still another objective is for the monitor to be readily reconfigurable.

In brief overview, the system and method of the invention feature continuously receiving an input analog signal; continuously sampling and digitizing the analog signal; buffering the digitized data; computing in real-time from the digitized data a parameter value that represents a characteristic of the stimulus; discarding the digitized data after the data is used to compute the parameter value; outputting computed parameter values, for example, to a system bus or to a storage medium; and continuing to sample, digitize, and buffer while outputting the parameter values to the system bus or storage medium, so as not to miss any transients that may have occurred during this period.

In one aspect, the invention features a system for characterizing a stimulus represented by an analog signal. Conversion circuitry continuously receives the analog signal and converts the analog signal into digital data. Digital circuitry continuously receives the digital data from the conversion circuitry. The digital circuitry dynamically computes from the digital data a value that characterizes a parameter of the stimulus while the digital circuitry continuously receives new digital data from the conversion circuitry. In one embodiment, the digital circuitry is re-programmable so as to be capable of characterizing a different parameter or parameters of the same or of a different type of stimulus. The conversion circuitry and the digital circuitry can be provided on the same or different integrated circuit chips, on the same or different circuit boards, and in a computer system or other electronic device, such as a meter.

In accordance with the type of transients being monitored, the system characterizes certain key parameters. For example, for electromagnetic transients, the characterized parameters include positive and negative peak amplitudes, duration of positive and negative transients, the rate of rise of the positive and negative transients, and energy.

The system includes a program memory storing a first program. In one embodiment, a digital signal processor is in communication with the program memory and computes the value that characterizes the parameter according to the first program. In another embodiment, the system includes programmable logic in communication with the digital signal processor. In this embodiment, the programmable logic computes the value that characterizes a second parameter as directed by the first program. Also, the programmable logic is reprogrammable by the digital signal processor as directed by the second program. In still another embodiment, the digital transient pulse monitoring system includes self-test circuitry.

The digital circuitry is in communication with a bus. While the digital circuitry outputs the computed value over the bus, the digital circuitry continuously receives new digital data from the conversion circuitry. The conversion circuitry can include a signal conditioner that receives the analog signal and modifies the analog signal to produce a modified analog signal having a particular voltage range.

In another aspect, the invention features a system that includes an analog-to-digital converter, a processing unit, and a memory buffer. The analog-to-digital converter receives an analog signal representing a stimulus and converts the analog signal into digital data. The processing unit dynamically computes from the digital data a value that characterizes a parameter of the stimulus. The memory buffer is in communication between the analog-to-digital converter and the processing unit and continuously receives new digital data from the analog-to-digital converter while the processing unit processes digital data obtained from the memory buffer to compute the parameter value. The rate at which the memory buffer receives new digital data from the A/D converter is less than the rate at which the processing unit receives digital data from the memory buffer. In one embodiment, the processing unit continuously obtains digital data from the memory buffer except while the processing unit is outputting a computed value.

In one embodiment, the processing unit includes a digital signal processor. The system can also include programmable logic in communication with the memory buffer to receive concurrently the same digital data that are received by the digital signal processor. The programmable logic and the digital signal processor dynamically compute, from the same digital data, values that characterize different parameters of the stimulus. Thus, in this embodiment, digital data passes from the memory buffer to the programmable logic and the digital signal processor concurrently, and while the digital signal processor characterizes a first parameter (e.g., energy), the programmable logic computes a second parameter (e.g., peak amplitude).

In another aspect, the invention features a method of characterizing a stimulus represented by an analog signal. Digital data are continuously received. These digital data are digitized from the analog signal representing the stimulus. A value that characterizes a parameter of the stimulus is dynamically computed from the continuously received digital data while new digital data, digitized from the analog signal representing the stimulus, are received. The new digital data that are received while the computed value is being outputted, for example, to a storage medium, are stored for subsequent processing. The continuously received digital data are processed at a rate that is greater than a rate at which the new digital data are received.

BRIEF DESCRIPTION OF THE DRAWINGS

The invention may be more completely understood in consideration of the detailed description which follows in connection with the accompanying drawings, in which.

DETAILED DESCRIPTION

Figure 1:
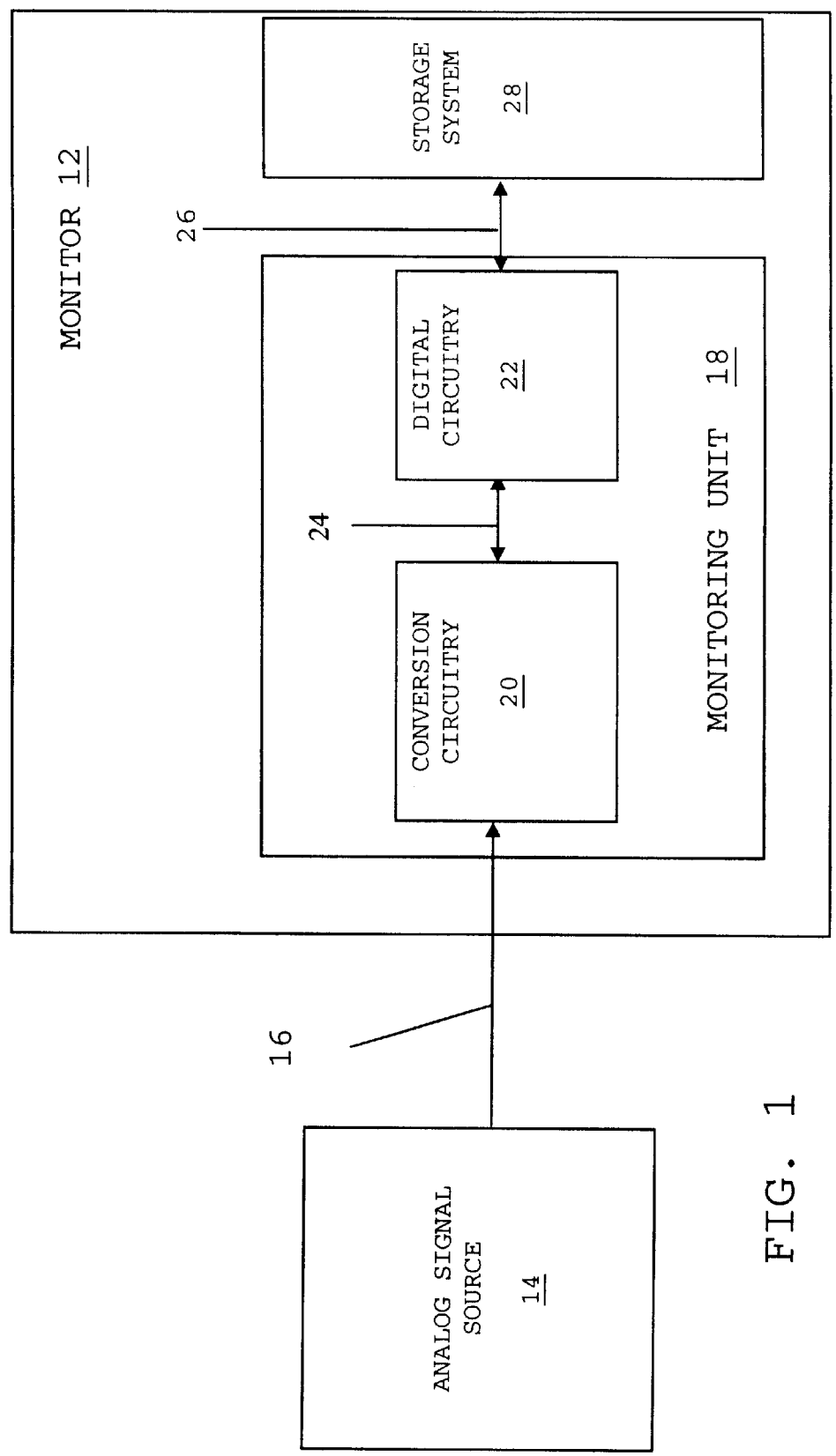
FIG. 1 is a block diagram illustrating an embodiment of a monitoring system, including a monitor in communication with an analog signal source.

FIG. 1 shows an embodiment of a monitoring system 10 including a monitor 12 constructed in accordance with the principles of the invention. The monitor 12 is in communication with an analog signal source 14 from which the monitor 12 receives an analog signal over a channel 16. The analog signal source 14 provides an analog signal that represents a naturally occurring or manmade stimulus.

The stimulus can originate from any form of energy, e.g., kinetic (dynamic) energy, potential (static) energy, radiation (electromagnetic) energy, heat, light, chemical, and electrical. Examples of types of stimuli include, but are not limited to, electromagnetic fields, static electricity, lightning, thermal shock, mechanical shock, vibration, noise, acoustic waves, RF signals, electric signals (digital and analog), photoelectric impulses, optical impulses, ultraviolet, infrared and visible light, radiation, chemical reactions, the flow of air (e.g., wind), gases and fluids, humidity, and pressure.

Generally, the monitor 12 is configured to measure one or more parameters of a particular stimulus or stimuli. These parameters are those generally known to indicate the presence of transient phenomena in the stimulus.

Also known as spikes or surges, electrical transients in general are momentary voltage or current changes that can have either a positive or a negative polarity and can add to or reduce energy in the affected waveform. Transient phenomena can be caused, for example, by the switching and commuting of electric motors, faults, electrostatic discharges, lightning, different types of loads, and abnormalities in the electrical impulses of an organism (e.g., an abnormal heart rate). Such electrical transients can also be produced by a transducer or sensor that converts any transient stimulus into a measurable current or voltage signal.

The monitor 12 includes a monitoring unit 18 having conversion circuitry 20 and digital circuitry 22. The conversion circuitry 20 is in communication with the analog signal source 14 over the channel 16 to receive the analog signal representing the stimulus. The conversion circuitry 20 samples and converts the analog signal into a digitized signal that represents the stimulus (referred to hereafter as digital data or digital data samples).

The digital circuitry 22 is in communication with the conversion circuitry 20 over a digitized signal bus 24 to receive the digital data, and is programmed to determine information about that digital data. In brief, the digital circuitry 22 is programmed to compute from the digital data at least one value that characterizes a parameter of the stimulus represented by that digital data.

The types of parameters characterized and computations performed by the digital circuitry 22 depend upon the type of stimulus targeted for monitoring by the monitoring system 10. Generally, the parameters of interest for a particular type of stimulus have been empirically determined to correlate to certain problems experienced by electronic and mechanical systems due to transients.

For example, key parameters associated with electrical transients, such as those encountered on utility power lines or with lightning, are positive and negative peak amplitudes, duration of positive and negative transients, the rate of rise of the positive and negative transients, and energy of the transients. An example of waveform norms (i.e., key parameters) are described in G. Baker, J. P. Castillo, and E. F. Vance, "Potential for a Unified Topological Approach to Electromagnetic Effects Protection", IEEE Transactions on Electromagnetic Compatibility, Vol. 34, No. 3, August 1992 and in Mil-Std-188-125: Appendix B. As another example, key parameters associated with mechanical shock or motion, as measurable using appropriate transducers, include displacement, velocity or acceleration.

As described further below, components of the digital circuitry 22 are re-programmable, that is, the monitor 12 can be modified to characterize a different parameter or parameters of the same or of a different type of stimulus, for example, after the monitor 12 has been deployed in the field.

The digital circuitry 22 is in communication with a storage system 28 by a bus 26 by which the digital circuitry 22 provides computed parameter values. Generally, the bus 26 conveys digital signals representing data, address, and control information and provides an electrical path by which a computer system can communicate with the monitoring unit 18. As a specific example, the bus 26 conveys computed parameter values to the storage system 28. Although shown to be part of the monitor 12, the storage system 28 can be external to monitor 12.

During operation of the monitor 12, the conversion circuitry 20 continuously receives the analog signal over the channel 16 and, in real time, samples and converts the analog signal into a stream of digital data (i.e., the digitized signal) representing the stimulus. The conversion circuitry 20 places the stream of digital data on the digitized signal bus 24 as the conversion circuitry 20 produces the digital data. Accordingly, the stream of digital data on the digitized signal bus 24 is continuous.

The digital circuitry 22 continuously receives the stream of digital data representing the stimulus from the digitized signal bus 24. While continuously receiving new digital data, the digital circuitry 22 computes from the digital data one or more values that characterize a parameter of the stimulus. After the parameter values are computed, the digital data from which the values are computed are no longer used and discarded, thus avoiding the need for a large amount of storage to hold the digital data samples. Although discarding the digital data samples is advantageous in this respect, in some embodiments the monitor 12 can be configured with storage to save some or all of the digital data samples for additional processing.

The digital circuitry 22 temporarily stores each computed parameter value in local storage (e.g., in at least one register). At certain times, the digital circuitry 22 provides the computed value(s) over the bus 26 to the storage system 28. The digital circuitry 22 can provide the computed parameter values to the bus 26 automatically at periodic intervals or upon receiving a request over the bus 26 (e.g., from an application program executing on a local system or remotely over a network).

In accordance with the principles of the invention, the digital circuitry 22 continues to receive new digital data while computing parameter values and outputting the parameters values to the storage system 28 over the bus 26. In one embodiment, the digital circuitry 22 achieves the continuous operation by temporarily buffering the newly received digital data, as described in more detail below. Consequently, the monitor 12 encounters no periods of "dead time" during which data representing the stimulus are lost before the monitor 12 can evaluate that data. This continuous operation provides an advantage over monitors that can miss transients due to dead time.

From the storage system 28, the computed value(s) can pass to an application program running locally on a computer system or remotely over a computer network. The application program can perform a variety of operations on the computed parameter values to determine if the computed parameter values indicate the occurrence of transient phenomena. For example, the application program can graphically present the computed values to a user in a graphic user interface by which the user can visually determine from the displayed parameter values whether potentially harmful transient phenomena have occurred. As another example, the application program can compare each computed parameter value with a predetermined threshold value and set an audible or visible system alarm if the parameter value exceeds the threshold value. Accordingly, a user can determine in near-real-time if transient phenomena have occurred (i.e., delayed from real-time by the time taken for the conversion circuitry 20 to receive and convert the analog signal into digital data and for the digital circuitry 22 to compute and transmit the parameter values to the storage system 28).

Application programs can also operate on the computed parameter values in a "post-processing" fashion (i.e., non-real-time). For example, an application program can access the computed parameter values stored in the storage system 28 to perform a variety of post-processing analyses, such as computing mean, median, standard deviations, and the like.

Figure 2:
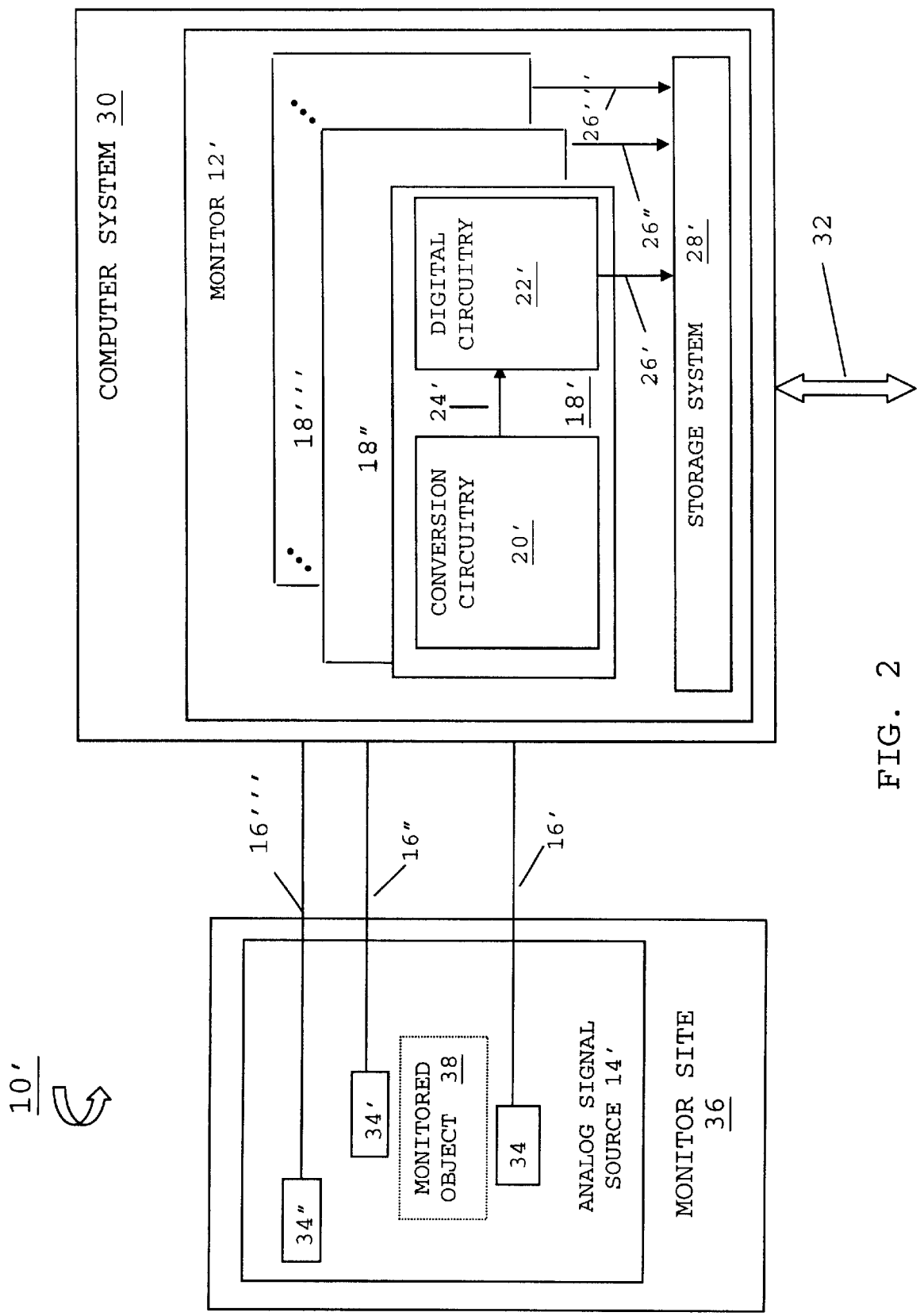
FIG. 2 is a block diagram illustrating an embodiment of the monitor.

FIG. 2 shows an embodiment of the monitoring system 10' including a computer system 30 constructed in accordance with the principles of the invention. The computer system 30 can be, for example, a personal computer (486, Pentium-based, IBM PC-compatible, etc.), Macintosh computer, RISC Power PC, X-device, workstation, mini-computer, mainframe computer or similar computing device. The computer system 30 can be connected to a computer network, for example, a local-area network (LAN), a wide-area network (WAN), the Internet and the World Wide Web, by a network connection 32. The network connection 32 can be through a standard telephone line, cable modem, digital subscriber line (DSL), LAN or WAN link (e.g., T1, T3, 56 Kb, X.25), broadband connection (ISDN, Frame Relay, ATM), or wireless connection. The network connection 32 is established using a communication protocol, e.g., TCP/IP, HTTP, IPX, SPx, NetBIOS, Ethernet, RS232, and direct asynchronous connections.

The computer system 30 includes a monitor 12' having a plurality of monitoring units 18', 18", and 18'" (generally, monitoring unit 18'). The monitoring units 18', 18", and 18".' are each in communication with a storage system 28' by busses 26', 26", and 26'". (collectively, bus 26'), respectively, for providing to the storage system 28' parameter values computed by that monitoring unit 18'. Although three monitoring units 18' are shown, the invention can be practiced with fewer (at least one) or more monitoring units 18'. In one embodiment, each monitoring unit 18' is on a separate circuit board that plugs into a motherboard of the computer system 30. The bus 26' can be a proprietary or industry standard electrical signal bus (e.g., ISA (Industry Standard Architecture), PCI (Peripheral Component Interconnect), Compact-PCI, USB (Universal Serial Bus), Ethernet), that conveys digital signals representing data, address, and control information.

Each monitoring unit 18' includes conversion circuitry 20' in communication with digital circuitry 22' over a digitized signal bus 24'. The conversion circuitry 20' and digital circuitry 22' of one monitoring unit 18' can be implemented on one or more integrated circuit (IC) chips. In one embodiment, one circuit board has a plurality of such IC chips, with each IC chip providing the functionality of a monitoring unit 18'.

The computer system 30 is in communication with an analog signal source 14' over channels 16', 16", 16'". The analog signal source 14' includes a plurality of detectors or transducers 34, 34', and 34" (generally, transducer 34). The transducers 34 are placed at various locations at a monitor site 36 for detecting a type of targeted stimulus.

Each transducer 34 is an electronic device that converts energy from one form to another. Examples of transducers include position and pressure sensors, thermometers, microphones, and antennas. Pressure sensors for example, measure force. As another example, microphones convert sound energy into electrical signals.

The type of transducer 34 used in the monitoring system 10' depends upon the type of targeted stimulus. For example, in the detection of transient phenomena associated with lightning, the transducers are electromagnetic sensors. Such electromagnetic sensors include current sensors, electric-field sensors, and B-dot sensors for measuring rate-of-change of the magnetic field of free space. Typically, all of the transducers 34 of the monitoring system 10 detect the same type of stimulus. In some embodiment, the monitoring system 10 uses a first transducer to detect a first type of stimulus and a second transducer to detect a second different type of stimulus.

Each transducer 34, 34', 34" is in communication with a respective monitoring unit 18', 18", 18'" over a respective channel 16, 16', 16" to provide an analog signal representing the stimulus detected by that transducer 34 from its position at the monitor site 36. The monitor site 36 is any indoor or outdoor location where the particular stimulus of interest can occur. Examples of monitor sites include, but are not limited to, power networks, transmission lines, consumer facilities, spacecraft launch sites, and living organisms. Although not necessary to the practice of the invention, a monitored object 38 (shown in phantom) can be at the monitor site 36, with one or more the transducers 34 positioned about the object 38 so as to detect transients that may potentially affect the functionality of the object 38.

To illustrate this particular embodiment of the monitoring system 10', consider, for example, a spacecraft with its payload (i.e., the monitored object 38) awaiting launch at a launch site (i.e., monitor site 36). The spacecraft and payload have electronic and mechanical systems that are sensitive to transients induced by lightning. The monitor 12' is configured to monitor a stimulus (electromagnetic energy) near the spacecraft at the launch site. Transducers (here, electromagnetic sensors) 34 are placed at the launch site, near the spacecraft, so as to detect transients induced by direct or nearby lightning strikes. Each transducer 34 continuously detects and converts the stimulus into an analog signal, and the analog signals pass to the monitoring units 18', 18", and 18'" over the channels 16', 16", and 16'", respectively. The respective conversion circuitry 20' receives the analog signal and converts the analog signal into a continuous digital data stream. The digital data passes to the respective digital circuitry 22', which, in accordance with the principles of the invention, computes key parameters of the stimulus from the digital data in real-time. At certain times, the digital circuitry 22' provides the computed parameter values to the storage system 28' over the bus 26'.

As another example, the monitoring system 10' can be used for detecting transients in the heartbeat of a human (i.e., monitor site 36). The monitor 12' is configured to monitor a stimulus (electrical impulses) produced by the heart. Transducers (here, electrical sensors) 34 are placed at various places on the human body to detect the electrical impulses that occur during the heartbeat. Again, each transducer 34 continuously detects and converts the stimulus into an analog signal, and the analog signals pass to the monitoring units 18', 18", and 18'" over the channels 16', 16", and 16'", respectively.

Figure 3:
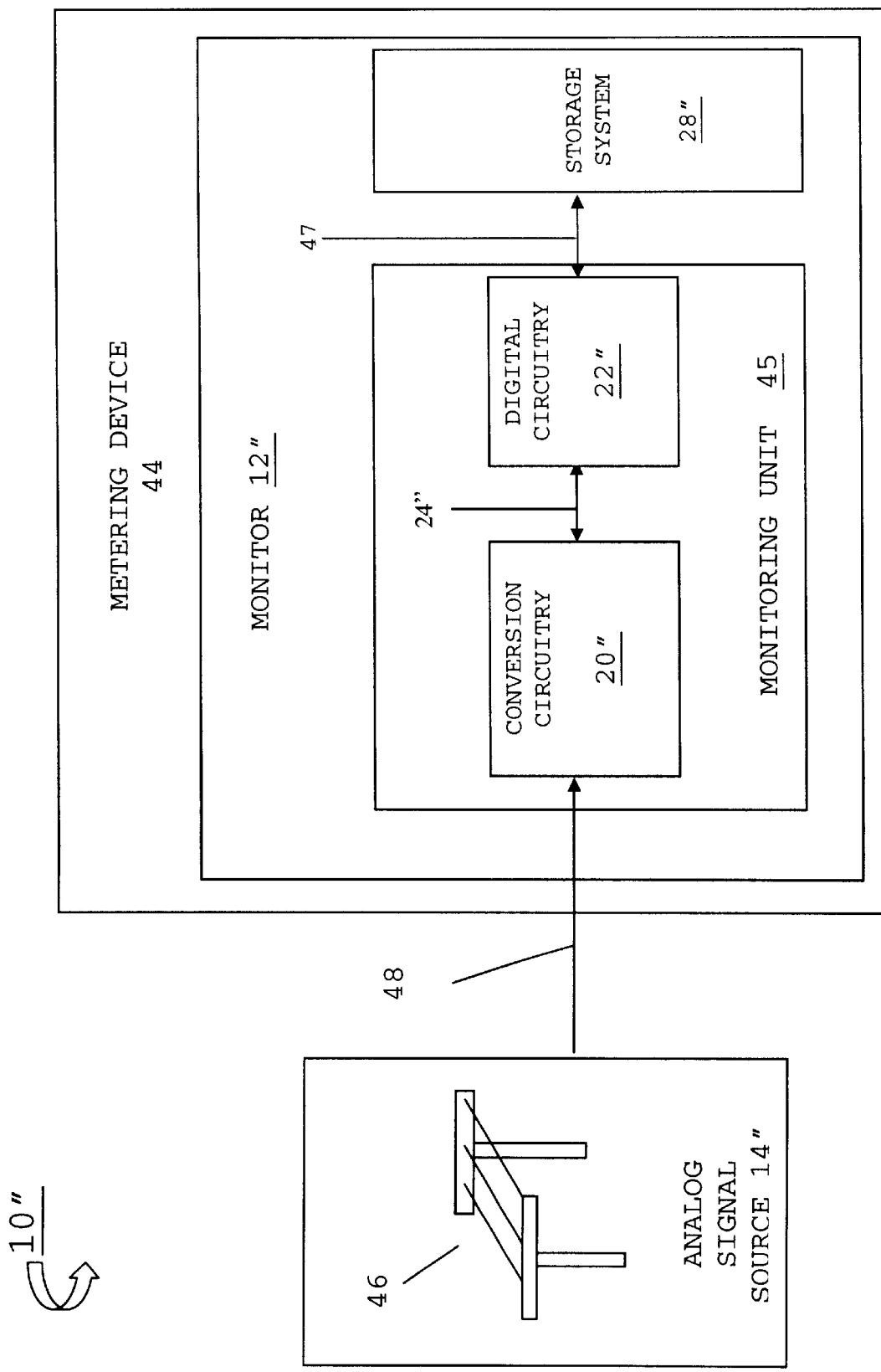
FIG. 3 is a block diagram illustrating another embodiment of the monitor.

FIG. 3 shows another embodiment of the monitoring system 10" including a metering device 44 embodying the principles of the invention. The metering device 44 includes a monitor 12" having a monitoring unit 45. The monitoring unit 45 is a specific embodiment of the monitoring unit 18 shown in FIG. 1. The monitoring unit 45 is in communication with a storage system 28" by a bus 47 for providing to the storage system 28" parameter values computed by the monitoring unit 45.

The monitoring unit 45 includes conversion circuitry 20" in communication with digital circuitry 22" over a digitized signal bus 24". Similar to the embodiment shown in FIG. 2, the conversion circuitry 20" and digital circuitry 22" can be implemented on one or more integrated circuit (IC) chips.

The metering device 44 is in communication with an analog signal source 14" over a channel 48. The analog signal source 14" includes utility or power lines 46 that carry electricity. In contrast to the embodiment shown in FIG. 2, the monitoring system 10" of FIG. 3 does not use a transducer 34 to detect and convert the stimulus into the analog signal. In this embodiment, the electricity on the power lines 46 is the analog signal that passes to the monitor 12". The monitoring unit 45 of the monitor 12" then digitizes and analyzes the analog signal for transients. Specifically, the conversion circuitry 20" receives the analog signal and converts the analog signal into a continuous digital data stream. The stream of digital data passes to the digital circuitry 22", which, in accordance with the principles of the invention, computes key parameters of the stimulus from the digital data in real-time, and, at certain times, provides the computed parameter values to the storage system 28" over the bus 47.

As another example, the analog signal source 14" can be a cable outlet that provides a cable connection between a home and the Internet. In this case, the analog signal is the RF signal carried by the cable, and the monitoring unit 45 is in communication with the cable outlet and designed to receive, convert, and analyze the RF signal for transients in accordance with the principles of the invention described below.

Figure 4:
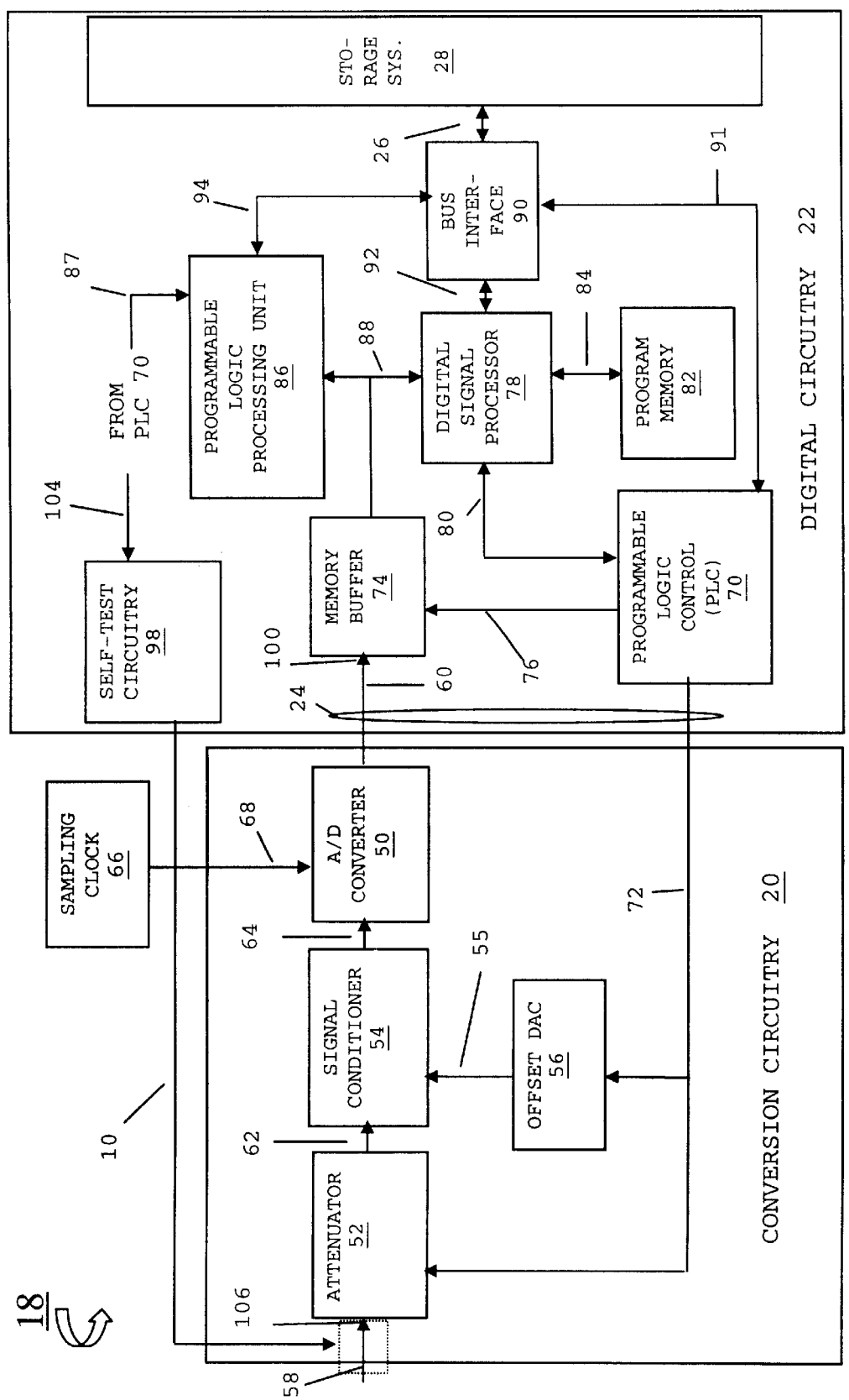
FIG. 4 is a block diagram illustrating an embodiment of a monitoring unit of the monitor shown in FIG. 1.

FIG. 4 shows an embodiment of the conversion circuitry 20 and of the digital circuitry 22 of the monitoring unit 18 of FIG. 1. The conversion circuitry 20 includes an analog-to-digital (A/D) converter 50 and, optionally, an attenuator 52, a signal conditioner 54 and an offset DAC 56 to make the input analog signal 58 suitable for input to the A/D converter 50.

In embodiments without the attenuator 52, the signal conditioner 54, and offset DAC 56, the A/D converter 50 is in communication with the analog signal source 14 to receive the input analog signal over an analog signal bus 58. The A/D converter 50 is also in communication with the digital circuitry 22 to provide a digitized signal over a digitized signal bus 60.

In embodiments with the attenuator 52, the signal conditioner 54 and the offset DAC 56, the attenuator 52 is in communication with the analog signal source 14 to receive the analog signal over the analog signal bus 58. The attenuator 52 is in communication with the signal conditioner 54 to provide an attenuated signal over an attenuated analog signal line 62, and the signal conditioner 54 is in communication with the A/D converter 50 to provide a conditioned analog signal over a conditioned analog signal line 64. The offset DAC 56 is in communication with the signal conditioner 54 over a signal line 55.

In embodiments not having the attenuator 52, the signal conditioner 54 is in communication with the analog signal source 14 to receive the input analog signal over the analog signal bus 58 and with the AID converter 50 to provide the conditioned analog signal over the conditioned analog signal line 64.

Features of the A/D converter 50 include an input voltage range, a resolution, and a sampling rate. In one embodiment, the A/D converter 50 is an AD9410, manufactured by Analog Devices of Norwood, Mass., which has a +/−0.75 V full scale input voltage range, a 10-bit resolution, and a sampling rate of at least 200 MHz.

The input voltage range depends upon the minimum and maximum voltages of the input analog signal received from the analog signal source 14 or of the conditioned analog signal received from the signal conditioner 54.

The resolution determines the number of voltage steps that are to be resolved by the A/D converter 50. For example, an A/D converter with 10-bit resolution divides the input analog signal into $2^{10}$ or 1,024 steps, producing 10 bits of digital data for each sample.

An external sampling clock 66 is in communication with the A/D converter 50 to provide a clock signal over signal line 68 that controls the sample rate of the A/D converter 50. The sample rate determines how accurately the input analog signal is characterized. The sample rate should be sufficiently high to capture transients associated with the type of stimulus targeted by the monitor 12. As a general rule, the sampling rate is at least twice the maximum frequency component in the analog signal 58. For example, to capture transients induced by lightning with frequency components as high as 10 MHz, the sampling rate is at least 20 MHz. For lower frequency components, such as those present in the electrical impulses of a heartbeat, the A/D converter 50 can sample at a lower rate.

The digital circuitry 22 includes programmable logic control 70 in communication with the attenuator 52 and offset DAC 56 by a control signal line 72, with a memory buffer 74 by a control signal line 76, with a digital signal processor (DSP) 78 by a control signal line 80, with a programmable logic processing unit 86 by a control signal line 87, and with a bus interface 90 by a control signal line 91. The DSP 78 is in communication with a program memory 82 over signal line 84. The memory buffer 74 is in communication with the A/D converter 50 to acquire in real-time the digitized signal produced by the A/D converter 50 over the digitized signal bus 60. The memory buffer 74 is also in communication with the DSP 78 and the programmable logic processing unit 86 by digital signal lines 88 that carry digital data. In one embodiment, the DSP 78 and the programmable logic processing unit 86 are incorporated in a single processing unit.

The DSP 78 and the programmable logic processing unit 86 are in communication with the bus interface 90 by data busses 92, 94 respectively. The bus interface 90 is in communication with the storage system 28 by the bus 26. The bus interface 90 handles the transfer of digital data between the DSP 78 and the storage system 28 and between the programmable logic processing unit 86 and the storage system 28.

In one embodiment, the programmable logic control 70, the programmable logic processing unit 86, and the bus interface 90 are implemented by a single programmable logic device (PLD). This PLD is dynamically programmable and its functionality can be changed in situ. An example of such a PLD is the EPF10K100, manufactured by Altera of San Jose, Calif. A portion of this particular PLD is configured to communicate with an ISA bus. A different bus other than an ISA bus and a corresponding bus interface can be used without departing from the principles of the invention. Depending upon designer preferences, the functionality of one or more of the other components of the digital circuitry 22, such as the DSP 78 and the memory buffer 74, can also be implemented in the PLD.

The memory buffer 74 operates in FIFO (first-in, first-out) fashion; that is, digital data samples exit the memory buffer 74 in the order that the digital data samples arrive at the memory buffer 74. In one embodiment, the capacity of the memory buffer 74 is 128K 32-bit words. One component for implementing the memory buffer 74 is an IDT72V36110, manufactured by Integrated Device Technology of Santa Clara, Calif.

The DSP 78 is programmable, has its own native instruction code and local registers, and is designed to execute arithmetic operations more rapidly and efficiently than standard microprocessors. The DSP 78 can implement instruction-level parallelism and operate in an architecture that supports multiple operations in a single clock cycle, for example, VLIW (Very Large Instruction Word). In one embodiment, the DSP 78 is implemented using a TMS320C6201, manufactured by Texas Instruments of Dallas, Tex.

The program memory 82 stores a program that instructs the DSP 78 regarding which parameter values to compute and where to store the computed values. The program memory 82 also stores configuration information for the programmable logic units 86, 70, and 90 to be used during operation by the DSP 78 to program the programmable logic units 86, 70, and 90. In one embodiment, the program memory 82 is a re-programmable device, such as a FLASH ROM. In this embodiment, the program stored in the program memory 82 can be modified to reconfigure the functionality of the DSP 78, programmable logic units 86, 70, and 90, and thus of the monitor 12.

The reconfigurability of the monitor 12 facilitates changes to the monitor 12 functionality after the monitor 12 has been deployed in the field. The program memory 82 can be reprogrammed in situ or replaced with a new ROM device having new program. For example, if the monitor 12 is initially programmed to compute a value for a first type of parameter, such as energy, the monitor 12 can be reprogrammed to compute a different parameter value. Also, by changing the program that controls the monitor 12, the monitor 12 that once was configured for a first type of transient, for example, electromagnetic transients associated with lightning, can presently monitor a different type of transient, for example, transients associated with chemical reactions. Modifying the monitor 12 to work with a different type of targeted stimulus can require other changes, for example, a different type of transducer that is capable of detecting the new target stimulus.

This re-programmability of the program memory 82 thus provides the monitor 12 with greater flexibility than monitors that are customized with specific hardware components to compute certain parameters. For example, this programmability enables the configuration of the monitor 12 to be customized during manufacturing, that is, in accordance with specified requirements of the customer. In another example, the monitor 12 can be customized in situ after being delivered to the customer and installed.

Unlike the monitor 12 of the invention, monitors with custom-specific hardware cannot be reconfigured to compute a different parameter or to respond to a different stimulus without having to replace the custom-specific hardware with new custom-specific hardware tuned to characterize the different parameter. The difficulty and complexity of reconfiguring such monitors effectively discourages any such reconfiguration. In contrast, reconfiguring the monitor 12 of the invention to compute a different parameter value or to search for transients in a different type of stimulus can be achieved by reprogramming, and without having to replace hardware components to tune the performance of the monitor 12.

Optionally, the monitor 12 includes self-test circuitry 98. By activating the selftest circuitry 98, a user can check whether the monitor 12 is operating properly. In one embodiment, the self-test circuitry 98 is in communication with the programmable logic control 70 by control line 104, and with an input terminal 106 of the conversion circuitry 20 by control line 108.

The DSP 78 activates a self-test by sending a first control signal to the programmable logic control 70 over the control line 80. In response, the programmable logic control 70 sends a control signal to the self-test circuitry 98 over control line 104. The self-test circuitry 98 issues a control signal that allows the input terminal 106 to be disabled. Disconnecting the input terminal 106 prevents the monitor 12 from receiving the analog signal from the analog signal source 14.

When disconnecting the input terminal 106 to the conversion circuitry 20, the self-test circuitry 98 issues a disconnect signal over control line 108. The self-test circuitry 98 generates an analog test signal and injects the analog test signal into the input terminal 106 over the signal line 108. In an embodiment without the attenuator 52, the offset DAC 56 generates the analog test signal and injects the analog test signal into the signal conditioner 54 over the signal line 55. From the analog test signal, the A/D converter 50 produces a stream of digital data samples that passes to the memory buffer 74. The DSP 78 computes parameter values from the digital data samples and forwards the parameter values to the storage system 28. An application program can then compare the computed parameter values with expected results to determine if the monitoring unit 18 is operating properly.

Figure 5A:
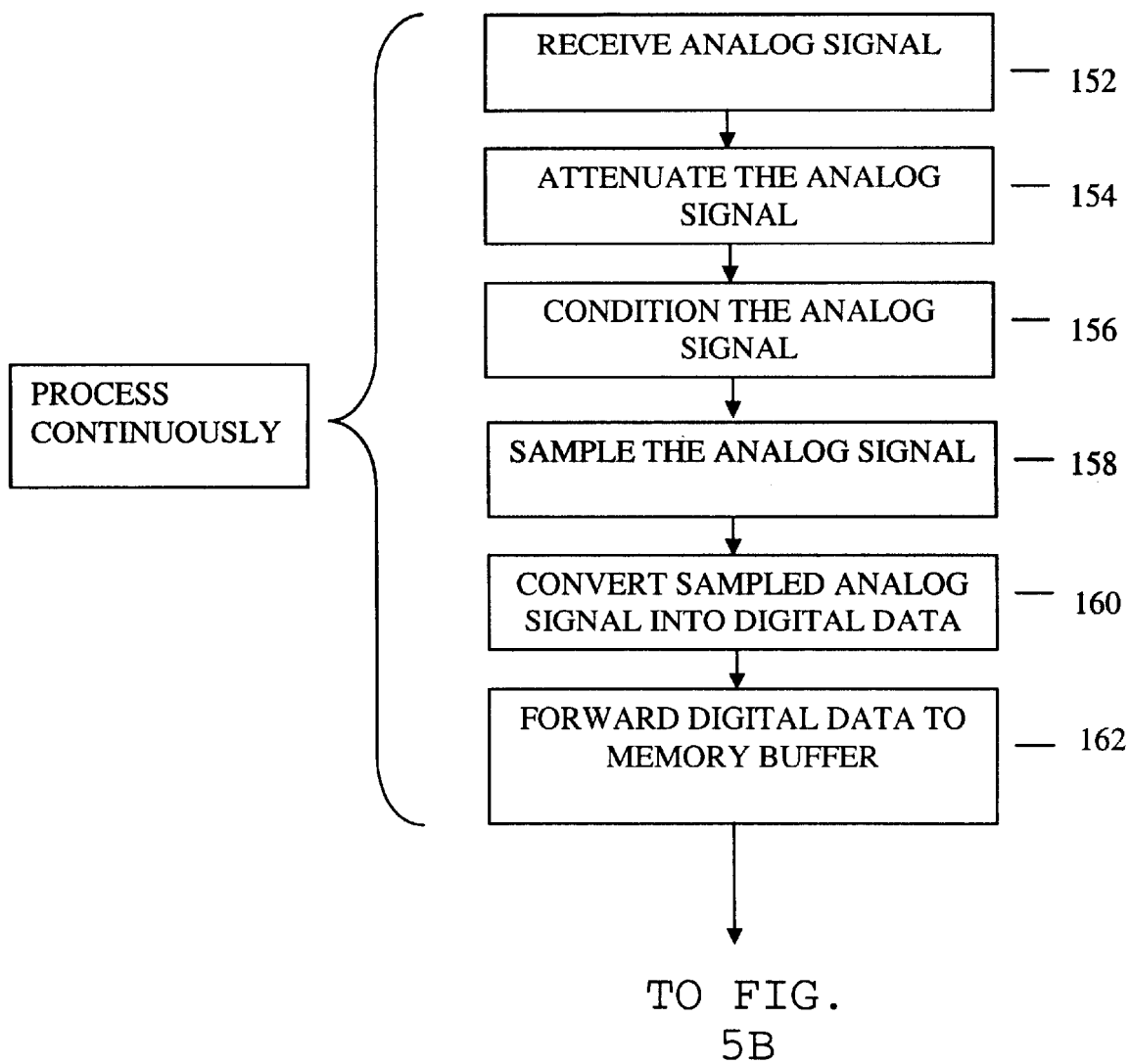
FIG. 5A and FIG. 5B are flow diagrams of an embodiment of a process used by the monitoring system to characterize a stimulus for transients.
Figure 5B:
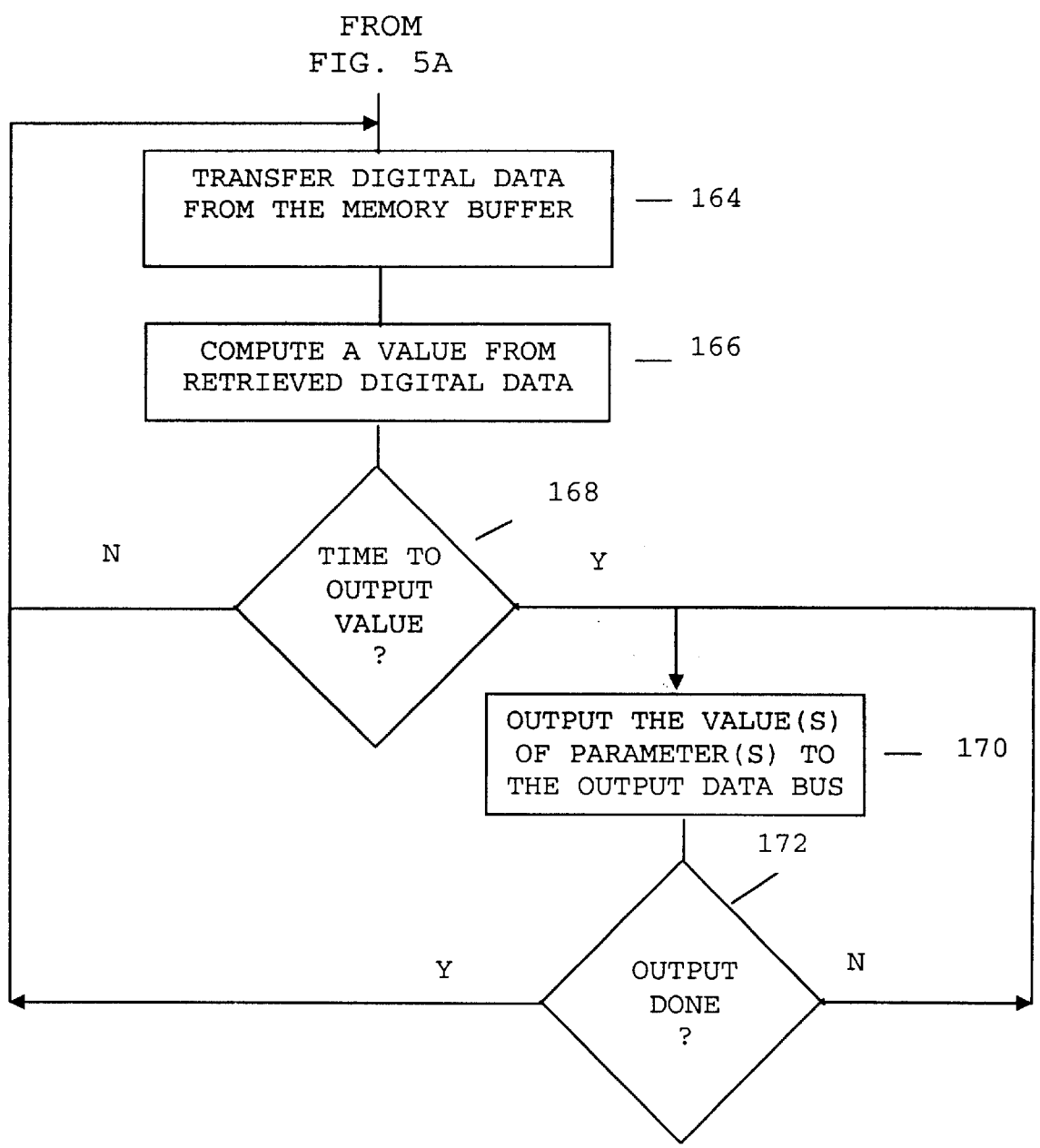

FIG. 5A and FIG. 5B show an embodiment of a process 150 performed by the monitor 12 shown in FIG. 4. For the purpose of illustration, the monitor 12 includes the attenuator 52 and the signal conditioner 54. Referring to FIG. 5A and to FIG. 4, in step 152 the monitor 12 receives an analog signal over input analog signal line 58. In one embodiment, the analog signal represents a stimulus detected by a transducer placed at a monitor site.

The attenuator 52 attenuates (step 154) the input analog signal 58 to produce an attenuated signal. For example, if the input analog signal has an input voltage range between +/−20 volts, the attenuator 52 can produce an attenuated signal with a reduced voltage range of +/−5 volts. The programmable logic control 70 provides a control signal to the attenuator 52 over control line 72. This control signal instructs the attenuator 52 as to the amount of attenuation to apply to the input analog signal. The attenuator 52 provides the attenuated signal to the signal conditioner 54 over the attenuated analog signal line 62.

The signal conditioner 54 modifies (step 156) the attenuated analog signal received from the attenuator 52 to produce a conditioned analog signal having particular input characteristics suitable for input to the A/D converter 50. Examples of signal conditioning that may be required by the A/D converter 50 include additional gain or attenuation, level shifting, offset trimming, and conversion of a single-ended sensor signal into a differential A/D signal.

In one embodiment, a function of the signal conditioner 54 is to bias the analog signal so that the analog signal has a particular voltage input range compatible with the A/D converter 50 (e.g., having a minimum of 0 volts). As an illustration, if the attenuated signal has a voltage range of +/−1 volt, the signal conditioner 54 biases the analog signal to have a voltage range, for example, of 0 to 2 volts.

In another embodiment, the signal conditioner 54 amplifies the analog signal. Continuing with the preceding example, the signal conditioner 54 can amplify the biased signal to produce the conditioned analog signal with a voltage range between 0 and 10 volts (in this example, the signal conditioner 54 has a gain of 5). The signal conditioner 54 provides the conditioned analog signal to the A/D converter 50 over conditioned analog signal line 64.

In another embodiment, the signal conditioner 54 provides an offset adjustment in order to accurately measure small DC signals. The programmable logic control 70 provides a control signal to the offset DAC 56 over control line 72, instructing the offset DAC 56 as to the voltage offset to apply to the attenuated analog signal over the signal line 55.

In yet another embodiment, the signal conditioner 54 converts a single-ended input signal into a differential signal. In this case, the input signal 62 is a single conductor with a voltage referenced to ground. The signal conditioner 54 converts this signal into a differential signal. Output conditioned signal 64 thus consists of two conductors, each at a common potential to ground, but with the potential between them representing the signal. For example, if the input signal 62 is a signal of +/−1 volt, referenced to ground, the signal conditioner 54 transforms that input signal 62 into an output conditioned signal 64 consisting of two conductors with a potential difference of +/−1 volt between them.

The A/D converter 50 receives the conditioned analog signal over signal line 64 and, for each clock signal received from the sampling clock over clock signal line 68, samples (step 158) and digitizes (step 160) the conditioned analog signal into a continuous stream of digital data. Upon digitizing the conditioned analog signal, the A/D converter 50 forwards (step 162) the digital data samples to the memory buffer 74 over the digitized signal bus 60. The steps of receiving, sampling, and digitizing the analog signal to produce digital data samples, and forwarding the digital data samples to the memory buffer 74 occur continuously during the process 150.

Referring to FIG. 5B, in step 164, the programmable logic control 70 sends a control signal over control line 76 to the memory buffer 74 to prepare the memory buffer 74 to receive digital data samples from the A/D converter 50. The DSP 78 and the programmable logic processing unit 86 concurrently obtain the digital data samples from the memory buffer 74 over the digital data bus 88. The programmable logic control 70 also sends a control signal to the DSP 78 over the control line 80 instructing the DSP 78 when to compute parameter values, when to cooperate with the programmable logic processing unit 86, and when to provide computed values to the bus interface 90.

The DSP 78 retrieves program instructions stored in the program memory 82 over the signal line 84. Under the control of the retrieved instructions, the DSP 78 computes (step 166) one or more parameter values from the digital data samples obtained from the memory buffer 74, for example, in blocks or chunks of samples. In one embodiment, the computed parameters that are measured from the digital data include the peak negative amplitude, peak positive amplitude, the duration and rate of rise of positive and negative transients, peak energy, and peak power of the input analog signal. Computing such parameters in the digital domain, rather than using analog circuitry to make the computations, improves the accuracy of the measurements. The DSP 78 then stores the parameter value (s) in a local register and, in one embodiment, no longer uses the digital data samples from which the parameter values are computed. In effect, the raw digital data samples (i.e., the digitized analog signal that represented the stimulus) are thrown away. Other embodiments can save the raw digital data samples for subsequent processing.

In one embodiment, the programmable logic processing unit 86 cooperates with the DSP 78 to perform parameter value computations. As the DSP 78 reads in digital data on bus 88, the programmable logic processing unit 86 decodes this operation and simultaneously reads the same digital data. Consider, for example, the computation of peak energy. To compute the peak energy from the digital data, the DSP 78 performs the more computationally intensive calculations involved in computing the energy, such as squaring the digital data value, and the programmable logic processing unit 86 performs less complicated calculations, such as determining the peak amplitude by comparing the digital data on the bus 88 with a currently stored amplitude, and storing the value on the digital data bus 88, if that value is larger.

In step 168, it is determined whether to output the computed parameter value to the bus 26. The programmable logic control 70 provides a control signal over signal line 80 instructing the DSP 78 to provide the computed parameter values to the bus interface 90. The programmable logic control 70 can be programmed to issue this control signal periodically, or under the control of the storage system 28 by signal line 91 from the bus interface 90.

In those embodiments in which the DSP 78 and programmable logic processing unit 86 cooperate to compute values, the programmable logic control 70 provides a control signal over signal line 87 instructing the programmable logic processing unit 86 to provide the computed parameter values to the bus interface 90. Using the previous example involving the computation of peak amplitude, in response to receiving a control signal from the programmable logic control 70 over signal line 87, the programmable logic processing unit 86 outputs the current stored amplitude value to the bus interface 90, for subsequent forwarding to the storage system 28. This value represents the peak signal amplitude detected since the previous amplitude value that the programmable logic processing unit 86 provided to the bus interface 90. The stored amplitude value is then reset in preparation for subsequent computations.

In one embodiment of the process 150, providing parameter values to the bus interface 90 interrupts the processing of the digital data by the DSP 78 and, where applicable, by the programmable logic processing unit 86. The duration of the interruption is less than the size of the memory buffer (in samples) divided by the frequency of the sampling clock 66. During this interruption, the DSP 78 or the programmable logic processing unit 86 does not obtain digital data from the memory buffer 74 and does not compute additional parameter values Thus, the DSP 78 and the programmable logic processing unit 86 continuously retrieve digital data from the memory buffer 74 except while outputting a computed value to the bus 26.

If it is not yet time to output the computed parameter value(s), the DSP 78 and programmable logic processing unit 86 continue to obtain digital data from the memory buffer 74 and to compute parameter values (steps 164 and 166). If it is time to output computed values, in step 170 the DSP 78 and the programmable logic processing unit 86 transfer the computed value(s) to the bus interface 90 over data lines 92 and 94, respectively. The bus interface 90 provides the parameter value(s) to the storage system 28 over the bus 26.

When the process of outputting parameter values is complete (step 172), the DSP 78 sends a signal to the programmable logic control unit 70, indicating that the DSP 78 is available to receive new digital data. The DSP 78 resumes obtaining digital data from the memory buffer 74 (step 164) and computing parameter values (step 166).

During the process 150, the memory buffer 74 is typically nearly empty. The rate at which the DSP 78 retrieves digital data from the memory buffer 74 exceeds the rate at which the memory buffer 74 receives new digital data from the conversion circuitry 20. Unless the DSP 78 is outputting computed values, the DSP 78 processes digital data samples (e.g., in blocks or chunks of samples) soon after the data samples are available in the memory buffer 74. When the DSP 78 is outputting values to the bus interface 90, digital data samples begin to accumulate in the memory buffer 74. The rate at which the memory buffer 74 receives new digital data samples, the size (i.e., depth) of the memory buffer 74, the time it takes for the DSP 78 to complete outputting parameter values, and the rate at which the DSP 78 retrieves digital data samples from the memory buffer 74 contribute to preventing the memory buffer 74 from overflowing.

While the invention has been shown and described with reference to specific preferred embodiments, it should be understood by those skilled in the art that various changes in form and detail may be made therein without departing from the spirit and scope of the invention as defined by the following claims. More specifically, although the described embodiments achieve real-time transient pulse monitoring without dead time by employing an A/D converter, buffer memory, and a digital signal processor, various changes to this configuration may be made to ensure a continuous stream of digital data and real-time processing of that digital data stream. For example, one change is to use a digital signal processor that does not interrupt computing parameter values to output data to the bus. In another example, continuous processing of the digital data is achieved by alternating between a pair of digital signal processors; that is, alternately, one digital signal processor receives digital data and computes parameter values while the other digital signal processor outputs the parameter values that it has computed. In another example, multiple digital signal processors are employed, each computing, in parallel, a characteristic or set of characteristics of the input signal.

What is claimed is:

1. A system for characterizing a stimulus represented by an analog signal, the system comprising:
   conversion circuitry continuously receiving the analog signal and converting the analog signal into digital data; and
   digital circuitry in communication with the conversion circuitry to receive continuously the digital data from the conversion circuitry, the digital circuitry dynamically computing from the digital data a value that characterizes a parameter of the stimulus while the digital circuitry continuously receives new digital data from the conversion circuitry.

2. The system of claim 1 wherein the digital circuitry is in communication with a bus, and wherein the digital circuitry outputs the computed value over the bus while the digital circuitry continuously receives new digital data from the conversion circuitry.

3. The system of claim 1, wherein the characterized parameter is a first parameter, and wherein the digital circuitry is programmed to characterize the first parameter and is re-programmable to characterize a second parameter that is different than the first parameter.

4. The system of claim 3 wherein the stimulus is of a first type of stimulus and wherein the second parameter is associated with a different type of stimulus than the first type of stimulus.

5. The system of claim 1, wherein the characterized parameter is a peak amplitude of the stimulus.

6. The system of claim 1, wherein the characterized parameter is a peak energy of the stimulus.

7. The system of claim 1, wherein the conversion circuitry and the digital circuitry are provided on the same circuit board.

8. The system of claim 1 wherein the conversion circuitry and digital circuitry are provided in a computer system.

9. The system of claim 1, wherein the conversion circuitry and digital circuitry are provided on the same integrated circuit chip.

10. The system of claim 1, wherein the digital circuitry includes:

program memory storing a first program; and a digital signal processor in communication with the program memory, the digital signal processor computing the value that characterizes the parameter as directed by the first program, and wherein the program memory is re-programmable to store a second program that instructs the digital signal processor to compute a value that characterizes a different parameter than the parameter characterized according to the first program.

11. The system of claim 10, further comprising programmable logic in communication with the digital signal processor, the programmable logic computing a value that characterizes a second parameter as directed by the first program, the programmable logic being re-programmable by the digital signal processor as directed by the second program.

12. The system of claim 1 wherein the conversion circuitry comprises a signal conditioner that receives the analog signal, the signal conditioner modifying the analog signal to produce a modified analog signal having a particular voltage range.

13. The system of claim 1 further comprising self-test circuitry.

14. A system for characterizing a stimulus represented by an analog signal, the system comprising:

an analog-to-digital converter receiving the analog signal and converting the analog signal into digital data;

a processing unit dynamically computing from the digital data a value that characterizes a parameter of the stimulus; and a memory buffer in communication between the analog-to-digital converter and the processing unit, the memory buffer continuously receiving new digital data from the analog-to-digital converter while the processing unit processes digital data received from the memory buffer to compute the value that characterizes the parameter of the stimulus.

15. The system of claim 14 wherein the processing unit includes a digital signal processor in communication with the memory buffer.

16. The system of claim 15 wherein the processing unit includes programmable logic in communication with the memory buffer to receive concurrently the same digital data that are received by the digital signal processor, the programmable logic and the digital signal processor dynamically computing, from the same digital data, values that characterize different parameters of the stimulus.

17. The system of claim 14 wherein a rate at which the memory buffer receives new digital data from the AID converter is less than a rate at which the processing unit obtains digital data from the memory buffer.

18. The system of claim 14 wherein the processing unit continuously obtains digital data from the memory buffer except while the processing unit is outputting a computed value.

19. The system of claim 14, wherein the characterized parameter is a first parameter, and wherein the processing unit is programmed to characterize the first parameter and is re-programmable to characterize a second parameter that is different than the first parameter.

20. The system of claim 19 wherein the stimulus is of a first type of stimulus and wherein the second parameter is associated with a different type of stimulus than the first type of stimulus.

21. A method of characterizing a stimulus represented by an analog signal, the method comprising:

continuously receiving digital data digitized from the analog signal representing the stimulus; and dynamically computing from the continuously received digital data a value that characterizes a parameter of the stimulus while receiving new digital data digitized from the analog signal representing the stimulus.

22. The method of claim 21 further comprising converting the analog signal representing the stimulus into the digital data that are continuously received.

23. The method of claim 21 further comprising processing the continuously received digital data at a rate that is greater than a rate at which the new digital data are received.

24. The method of claim 21 further comprising storing, for subsequent processing, new digital data that are received while the computed value is being provided to a bus.

* * * * *

UNITED STATES PATENT AND TRADEMARK OFFICE
CERTIFICATE OF CORRECTION

PATENT NO.     : 6,639,538 B1
DATED          : October 28, 2003
INVENTOR(S)    : Sechi et al.

It is certified that error appears in the above-identified patent and that said Letters Patent is hereby corrected as shown below:

Column 6,
Line 29, delete "SPx" and substitute -- SPX --;
Line 33, delete "18".' " and substitute -- 18'". --;

Column 8,
Line 43, delete "A/ID" and substitute -- A/D --;
Line 60, delete "AID" and substitute -- A/D --;

Column 9,
Line 8, delete "AID" and substitute -- A/D --

Column 11,
Lines 25 and 62, delete "AID" and substitute -- A/D --;

Column 16,
Line 17, delete "AID" and substitute -- A/D --.

Signed and Sealed this

Sixth Day of January, 2004

JAMES E. ROGAN
*Director of the United States Patent and Trademark Office*